United States Patent [19]
Huynh

[11] Patent Number: 5,822,213
[45] Date of Patent: Oct. 13, 1998

[54] METHOD AND APPARATUS FOR DETERMINING THE CENTER AND ORIENTATION OF A WAFER-LIKE OBJECT

[75] Inventor: Tac Huynh, Newark, Calif.

[73] Assignee: Lam Research Corporation, Fremont, Calif.

[21] Appl. No.: 623,822

[22] Filed: Mar. 29, 1996

[51] Int. Cl.$^6$ .............................. G01B 7/13; G01B 9/00
[52] U.S. Cl. .................. 364/478.01; 702/150; 33/520; 33/549; 33/644
[58] Field of Search ................. 364/478.01, 559, 364/479.13, 478.09; 414/936, 937, 757; 356/400, 375; 702/150; 33/520, 549, 644

[56] References Cited

U.S. PATENT DOCUMENTS

| | | | |
|---|---|---|---|
| 4,819,167 | 4/1989 | Cheng et al. | 364/167.01 |
| 5,291,270 | 3/1994 | Koch et al. | 356/372 |
| 5,365,672 | 11/1994 | Kato | 33/520 |
| 5,466,945 | 11/1995 | Brickell et al. | 250/559.12 |
| 5,497,007 | 3/1996 | Uritsky et al. | 250/491.1 |

FOREIGN PATENT DOCUMENTS

| | | |
|---|---|---|
| 0435057 A1 | 7/1991 | European Pat. Off. . |
| 95/00819 | 1/1995 | WIPO . |

*Primary Examiner*—Kamini Shah
*Attorney, Agent, or Firm*—Burns, Doane, Swecker & Mathis, L.L.P.

[57] ABSTRACT

A device and method for determining the center and orientation of a circular workpiece such as a semiconductor wafer. A laser diode projects a sheet of light onto a linear array of charge coupled devices which measures light intensity as a semiconductor wafer is rotated with its outer periphery intersected by the sheet of light. From a plot of light intensity data versus position at the wafer edge, a derivative of such plot can be calculated to locate an orientation notch or flat in the edge of the wafer. Also, from the plot of light intensity versus edge position it is possible to locate the center of the wafer relative to a rotation axis of a spindle on which the wafer is supported.

24 Claims, 6 Drawing Sheets

… …

METHOD AND APPARATUS FOR DETERMINING THE CENTER AND ORIENTATION OF A WAFER-LIKE OBJECT

FIELD OF THE INVENTION

The present invention relates to determining the precise center of a wafer like object, such as a semiconductor wafer. More particularly, a laser is used with a CCD array to precisely determine the position of the edge of the wafer. The calculation of the physical center of the wafer is accomplished by an algorithm using the more precise position readings of the wafer's edge from the CCD array. Additionally, the algorithm is also able to determine the orientation of the semiconductor wafer from the position of the edge of the wafer.

BACKGROUND OF THE INVENTION

In the processing of semiconductor wafers by plasma etching, chemical vapor deposition, photolithographic etching and other means there is a need to precisely locate and align the wafer. Traditional means used mechanical pins that, through contact with the edge of the wafer, were able to determine the edge and then calculate the wafer's center. The use of pins is not sufficiently accurate for some microelectronic circuitry work. Additionally, the contact from pins has the effect of producing particulates which interfere with processing of the wafer.

A non-contact technique of determining the edge and center of a wafer involves the use of a movable detector including a light source and light detector which are spaced apart to allow a wafer to pass therebetween. Other non-contact techniques include height sensors for determining the location of a wafer flat (see U.S. Pat. No. 4,328,553) or an array of sensors which are located along a path of movement of the wafer (see U.S. Pat. No. 4,819,167). Although these techniques avoid contact of the wafer with pins and thus avoid the problem of generating particulates, they have limitations on accuracy. For instance, the light from a light source such as an LED, even with correcting optics, is not coherent and has a dispersionary effect that does not produce a true and accurate image of the wafer's edge. Additional inaccuracies in the image could result from movement of the light detector or wafer during the measurement process. Such inaccurate position readings could thus produce inaccurate results in the determination of the center and orientation of the semiconductor wafer. Given the increasing need to reduce the size of components in chip manufacture there is an ever increasing need to be able to precisely determine both the center and orientation of semiconductor wafers during processing.

A system for positioning of semiconductor wafers is disclosed in commonly owned U.S. Pat. No. 4,833,790. As shown in FIG. 1, the positioning system 10 includes a wafer shuttle 12, a position sensor 14, a rotatable spindle 16 on a base 17 and a central controller 24 comprising a programmable digital computer. The wafer shuttle 12 retrieves wafers W from a wafer cassette 18 and transports the wafers to the spindle 16 where the wafers are centered and aligned in a desired orientation prior to being removed by an articulated wafer transport arm 20 having a first segment 20a and a cradle segment 20b, both of which are located in an air lock 22 associated with processing equipment such as a plasma etch system, CVD reactor, or the like.

The wafer cassette 18 includes horizontal shelves 19 supporting individual wafers and the cassette is movable vertically by an elevator platform. The wafer shuttle 12 includes a carriage 40 mounted to horizontally reciprocate on a pair of guide rails 42 with the position of the carriage 40 being controlled by an electric drive motor 44 controlled by controller 24 through communication line 46 which passes into interface 26. A J-shaped support arm 50 secured to carriage 40 reciprocates along a linear path between the spindle 16 and the wafer cassette 18 as the carriage 40 is driven back and forth along guide rails 42. The support arm 50 can include vacuum ports for securing the wafer during transport. The arm 50 can be retracted to place a wafer over spindle 16 and spindle 16 can be raised so that the wafer is lifted above the arm 50.

The spindle 16 can include a vacuum port for firmly securing the wafer thereto. When placed on the spindle 16, the center of the wafer will be offset from the center of the spindle by an unknown distance in an unknown direction. The position sensor 14 includes a carriage 60 mounted on a rotating drive screw 62 driven by motor 64 which in turn is supervised by controller 24 through communication line 66. The carriage 60 includes an optical detector 68 and by translating the carriage 60 back and forth, the location of the periphery of the wafer along the linear path between the spindle and the cassette can be determined. The optical sensor 68 can be a light emitting diode source and a phototransistor detector.

The centering operation is described with reference to FIG. 2. In operation, the distance $r_1$, between the center of rotation CR and a point $P_1$, on the periphery of the wafer W, is measured after rotating the wafer through an angle $\Theta_1$ from an arbitrary baseline BL drawn through the center of rotation. The values of the radius $r_1$ and angle $\Theta_1$, are then stored in the controller 24. The wafer is then further rotated through a second angle $\theta_2$ relative to the baseline BL and the distance $r_2$ between the center of rotation CR and a point $P_2$ on the periphery of the wafer W is measured. Similar measurements are then made for a third point $P_3$ and when the measurements are completed, the length of offset l and angular offset $\alpha$ are calculated according to mathematical formulas. Once the offset angle $\alpha$ and offset length l have been determined, the wafer can be rotated by the spindle 16 so that the line between the center of rotation CR and the center of the wafer CW is aligned with the direction of the linear path travelled by the support arm 50. The wafer is then lowered onto the support arm 50 by retracting spindle 16 after which the support arm 50 is translated in the direction necessary to align the center of the wafer CW with the center of rotation CR. The spindle 16 can then be raised and the wafer is ready for further manipulation and processing.

It is an object of the present invention to provide a method and apparatus to precisely locate the edge, center and orientation of a semiconductor wafer in a manner which overcomes limitations of the prior art.

SUMMARY OF THE INVENTION

The invention provides a light detection system for locating a center and/or discontinuity on an edge of a circular workpiece, comprising: a rotatable spindle supporting a circular workpiece such that opposed first and second sides of an outer periphery of the workpiece are located radially outwardly of the spindle, the spindle being rotatable about an axis of rotation so as to rotate the workpiece therewith; a light source facing the first side of the workpiece, the light source projecting a sheet of light intersected by the outer periphery of the workpiece; a light detector facing the second side of the workpiece and receiving a portion of the sheet of light not intersected by the outer periphery of the workpiece; and a controller electrically connected to a motor driving the spindle and to the light detector, the controller receiving signals outputted from the light detector and signals outputted from the motor, the controller being operable to rotate the spindle to a plurality of angular positions, record data corresponding to points on an outer edge of the workpiece and determine a center of the workpiece relative to the axis of rotation of the spindle.

According to a preferred embodiment, the light detection system cooperates with a light detection transport mechanism engageable with the workpiece, the controller being operable to move the transport mechanism into engagement with the workpiece and move the workpiece to a position at which the center of the workpiece is coincident with the axis of the rotation of the spindle. The light source preferably comprises a laser diode and an optical lens, the optical lens focusing light from the laser diode into the sheet of light. The light detector preferably comprises an array of charge coupled devices. The spindle can be fixedly mounted so as to be immovable with respect to the light source and light detector. The light source preferably projects the sheet of light such that the sheet of light lies in a plane parallel to and passing through the axis of rotation of the spindle. The workpiece transporting mechanism can include an arm movable towards and away from the spindle, the spindle being movable in a direction parallel to the axis of rotation of the spindle, the arm of the workpiece transporting mechanism being movable to a position beneath the workpiece and engaging the workpiece by moving the spindle and lowering the workpiece onto the arm of the workpiece transporting mechanism. The workpiece is preferably a semiconductor wafer having a discontinuity along the outer periphery thereof, the controller being operable to determine the location of the discontinuity with respect to an angular orientation of the wafer and control rotation of the spindle to position the discontinuity at a desired angular orientation.

The invention also provides a method of detecting a center of a circular workpiece, comprising steps of: locating a circular workpiece on a rotatable spindle such that opposed first and second sides of an outer periphery of the workpiece are located radially outwardly of the spindle, the spindle cooperating with a light source facing the first side of the workpiece and a light detector facing the second side of the workpiece; projecting a sheet of light from the light source onto the workpiece such that the sheet of light is intersected by the outer periphery of the workpiece and a portion of the sheet of light not intersected by the outer periphery of the workpiece is received by the light detector; outputting signals from the light detector to a controller and recording data corresponding to a point on an outer edge of the workpiece; rotating the spindle such that the workpiece is rotated to a second angular position at which the sheet of light intersects the outer periphery of the workpiece, the controller receiving signals outputted from the light detector and recording data corresponding to a second point on the outer edge of the workpiece; and calculating a center of the workpiece relative to the axis of rotation of the spindle based on the data corresponding to the first and second points.

According to a preferred embodiment, the spindle is rotated by a motor electrically connected to the controller, the controller receiving signals outputted from the motor so as to record angular positions of the spindle. The method can include a moving transport mechanism beneath the workpiece, lowering the spindle such that the workpiece is supported on the transport mechanism, moving the transport mechanism to a position at which the center of the wafer is coincident with the axis of rotation of the spindle, and raising the spindle until the workpiece is removed from the transport mechanism and supported on the spindle. The signals are preferably continuously outputted from the light detector and data corresponding to points on the outer edge of the workpiece are recorded during one continuous revolution of the workpiece. The spindle can be fixedly mounted with respect to the light source such that the light source and spindle remain in the same positions while the signals corresponding to the first and second points are outputted by the light detector. The light source preferably projects the sheet of light such that the sheet of light lies in a plane parallel to and passing through the axis of rotation. The workpiece preferably comprises a semiconductor wafer having a discontinuity such as a flat or V-shaped notch on the outer periphery thereof, the method further comprising a step of determining the location of the discontinuity and rotating the spindle such that the discontinuity is located at a desired angular position. The location of the discontinuity on the edge of the workpiece can be determined by calculating a derivative of a plot of light intensity versus position recorded by the controller.

DETAILED DESCRIPTION OF THE PREFERRED EMBODIMENTS

The following description relates to a system and method for determining the center and orientation of a circular workpiece such as semiconductor wafers. Although the description is directed specifically toward semiconductor wafers, it will be appreciated that the principles of the invention apply equally well to centering and orienting other circular objects such as recording disks, magnetic media disks, circular bioassay plates, and the like.

Locating the center and determining the orientation of a semiconductor wafer is a necessary part of many manufacturing processes in the production of semiconductor chips and devices. In the case of a silicon wafer, the crystalline form of silicon used in semiconductor devices has a specific orientation which may affect the performance of devices made from the semiconductor wafer.

Figure 3:
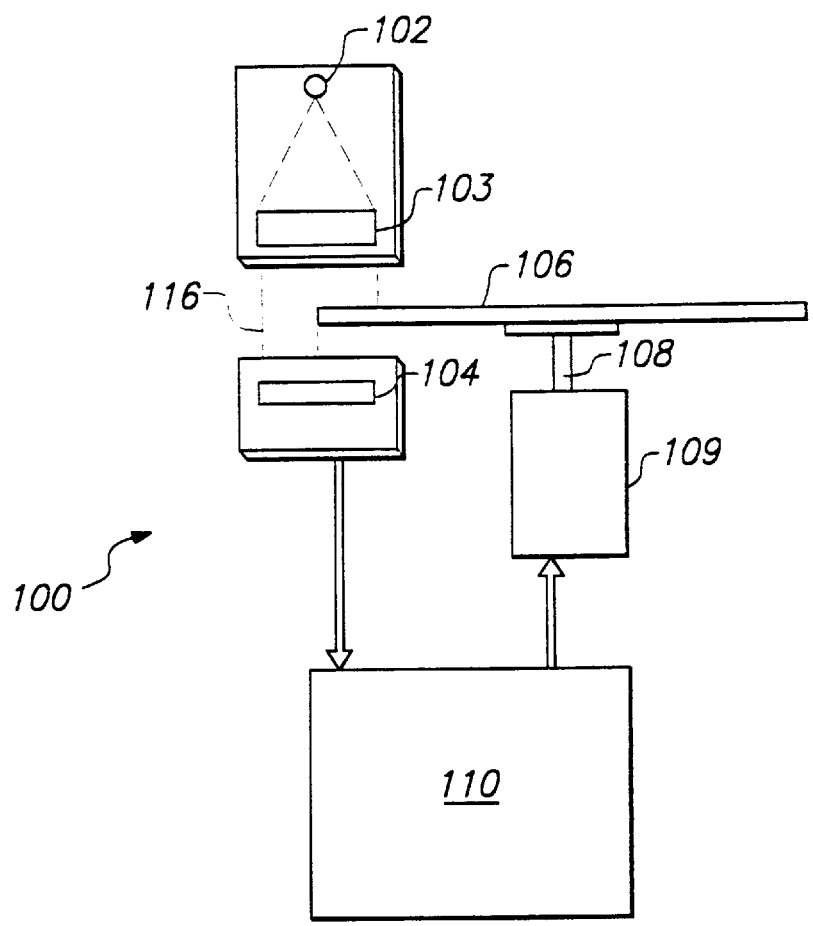
FIG. 3 shows a positioning system in accordance with the invention.

As shown in FIG. 3, a light detection system 100 in accordance with the invention includes a semiconductor wafer handling device, a laser diode 102 and an array of charge coupling devices (CCD) 104 separated from the laser diode. In the case where the circular workpiece is a semiconductor wafer, the laser diode and CCD array can be separated by about 2½ inches.

The laser diode 102 projects a beam of light in the direction of the CCD array 104. A wafer 106 to be centered is placed on a spindle 108 driven by motor 109 which rotates the wafer 106 such that the outer periphery of the wafer is between the laser diode and the CCD array. As the wafer 106 is rotated on the spindle 108 an unage of the wafer's edge is projected onto the CCD array 104 by the laser diode 102. The CCD array 104 continuously reads the image of the wafer's edge and sends signals (e.g., light intensity) to microcontroller 110 which correlates the angular position of the spindle 108 with the measured light intensity. This correlated data is stored in the system memory. The microcontroller 110 is programmed to take the correlated data on angular position of the spindle 108 and light intensity data from the CCD array 104 and calculate both the center of the wafer and the orientation of the wafer.

Figure 1:
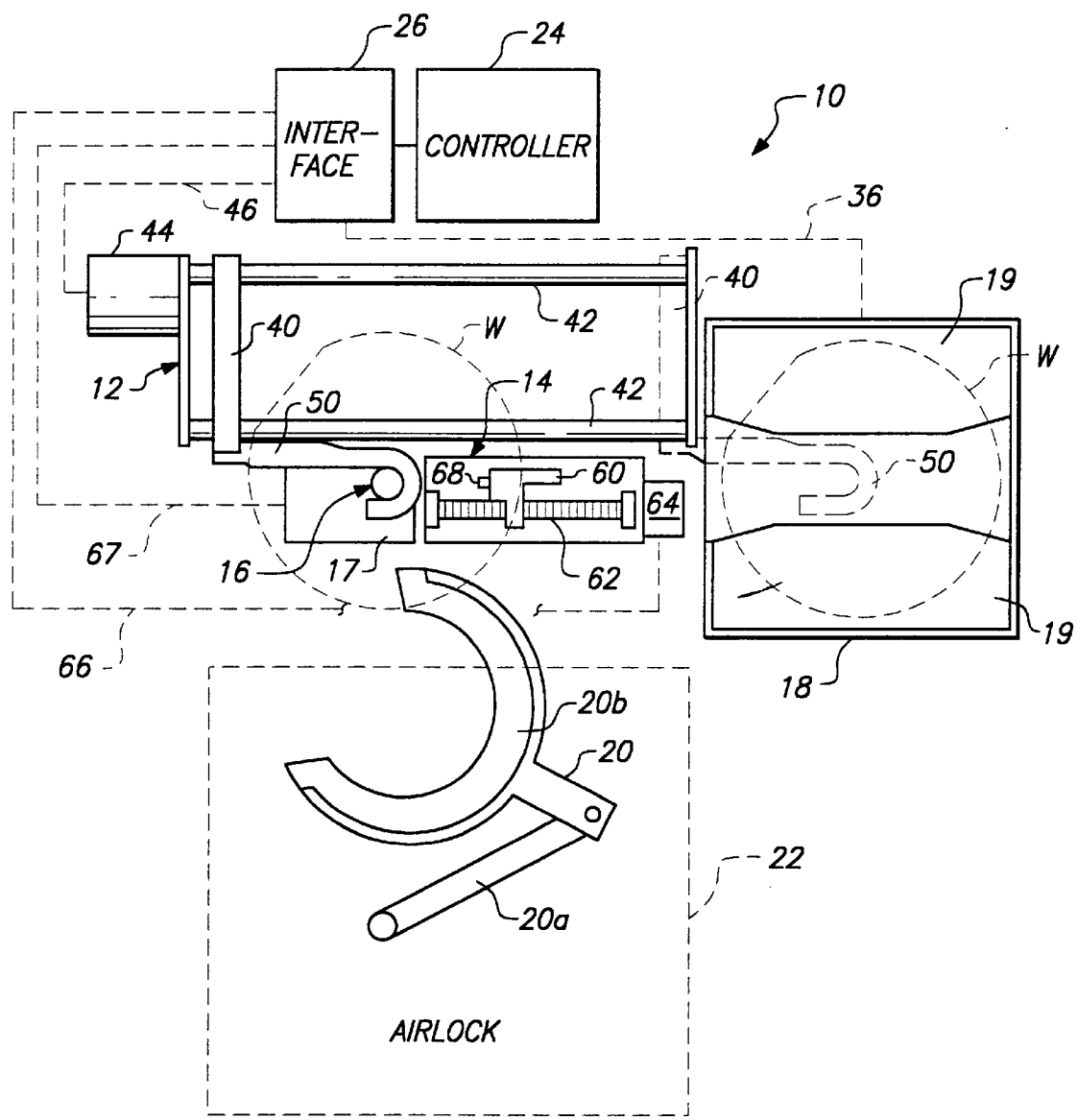
FIG. 1 shows a prior art positioning system.
Figure 2:
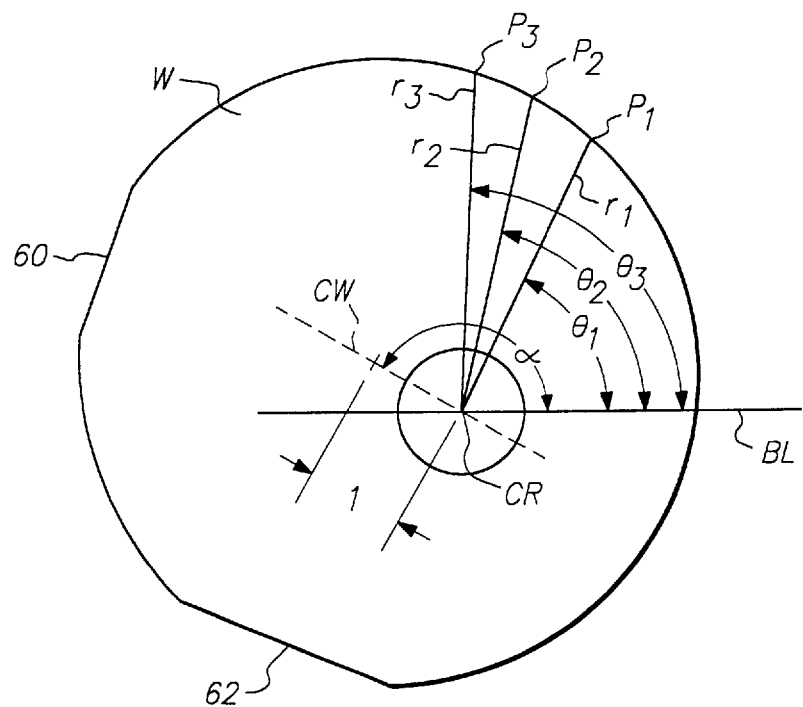
FIG. 2 shows an example of a silicon wafer with two flats and illustrates how measurements are made with the positioning system of FIG. 1.

As shown in FIG. 2, a semiconductor wafer W can have one or more flats 60, 62 or notches (not shown) forming one or more discontinuities in the outer edge of the wafer. The discontinuity can be used to indicate the orientation of the crystalline lattice structure of the semiconductor wafer W. Once the orientation of the wafer's crystalline lattice structure is known, the wafer can be rotated to a desired crystal orientation for further processing of the wafer into semiconductor chips and devices.

In the embodiment of the invention shown in FIG. 3, the semiconductor wafer 106 to be centered and aligned is placed on the spindle 108 by a suitable wafer transport mechanism such as that disclosed in commonly owned U.S. Pat. No. 4,833,790 or any other suitable apparatus such as a robotic arm movable to desired x-y or x-y-z positions. The spindle cooperates with a position sensor that outputs signals to the microcontroller representative of the angular position of the spindle 108 and thus the angular position of the semiconductor wafer 106. In order to project a beam of light which will accommodate off-center positioning of the wafer, discontinuities on the wafer periphery and even different size wafers, the light from the laser diode source 102 is shaped by an optical lens 103. The optical lens 103 shapes the beam of light from the laser diode 102 into a thin sheet of light 116. The sheet of light 116 is aligned with the CCD array 104 and produces an image of the edge of the semiconductor wafer 106. The sheet of light 116 is preferably parallel to and passing through an axis of rotation of the spindle 108. Thus, the CCD array measures variations in light intensity outputted from the CCD array due to changes in position of the projected image of the wafer edge position as the semiconductor wafer 106 is rotated on the spindle 108.

According to the invention, the location of a discontinuity on a circular workpiece can be determined by continuously measuring light intensity at points on the edge of the workpiece as the workpiece is rotated through one complete revolution and taking the derivative of the curve thus generated. The derivative provides a graph of positive and negative values of intensity and the point at which the line connecting the maximum and minimum intensity values intersects the zero axis represents the center of the discontinuity such as a notch or flat on a semiconductor wafer. It should be noted that the sinusoidal nature of the plot of measured light intensity versus position is the result of eccentricities due to the actual physical shape of the wafer and location of the wafer on the rotating spindle.

Figure 4A:
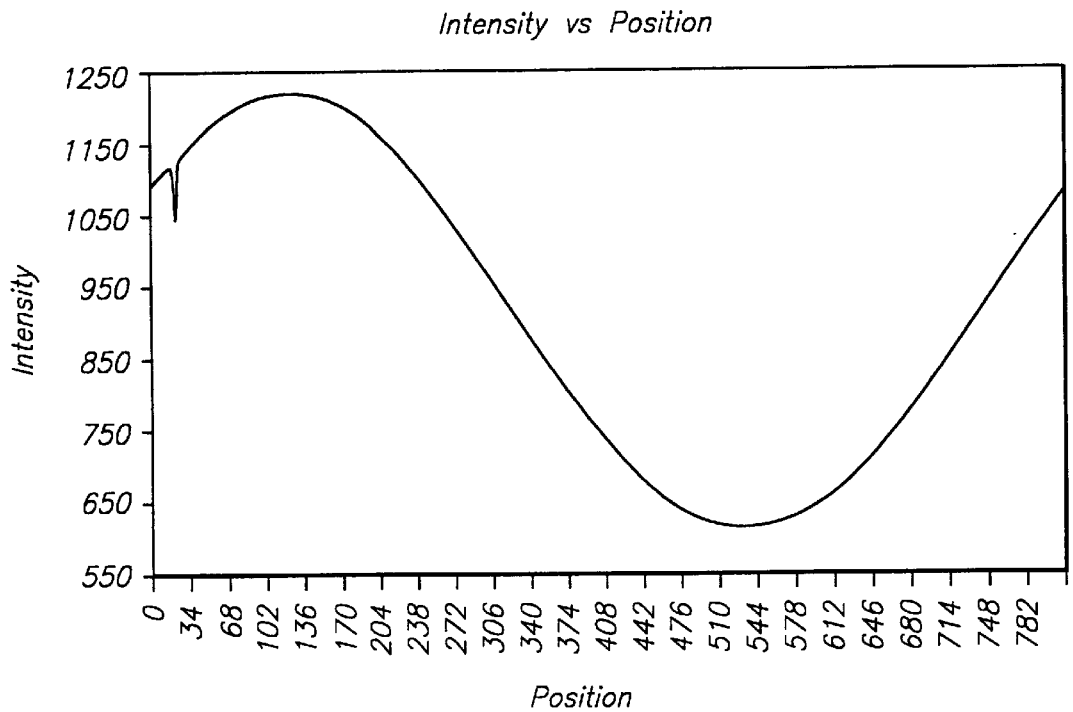
FIGS. 4a–4c show graphs of intensity measurements versus position and indicate the location of a V-shaped notch in a semiconductor wafer.
Figure 4B:
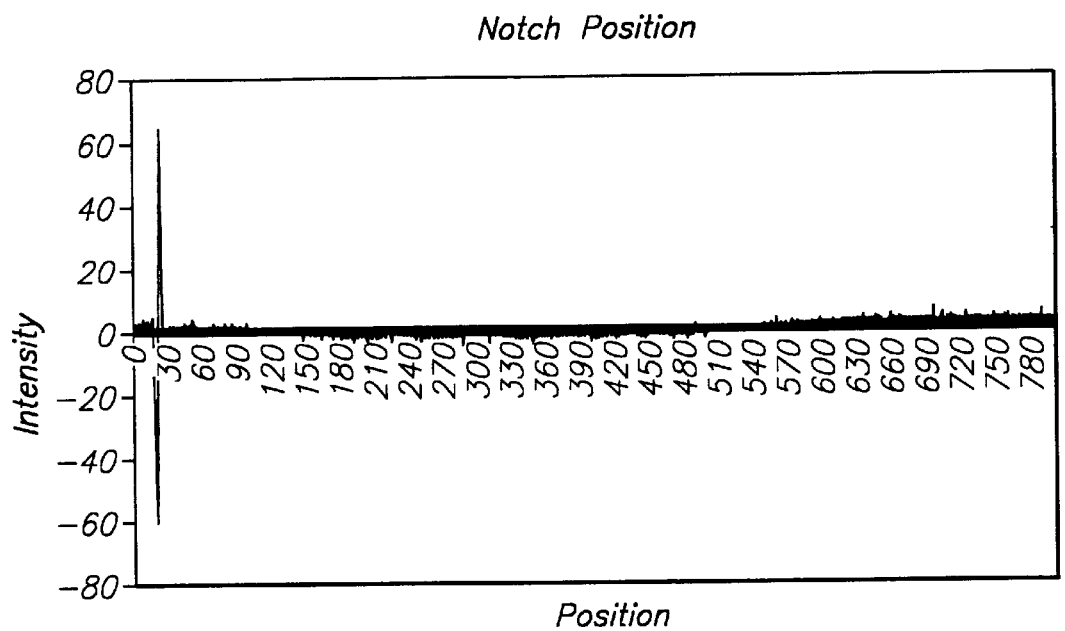
Figure 4C:
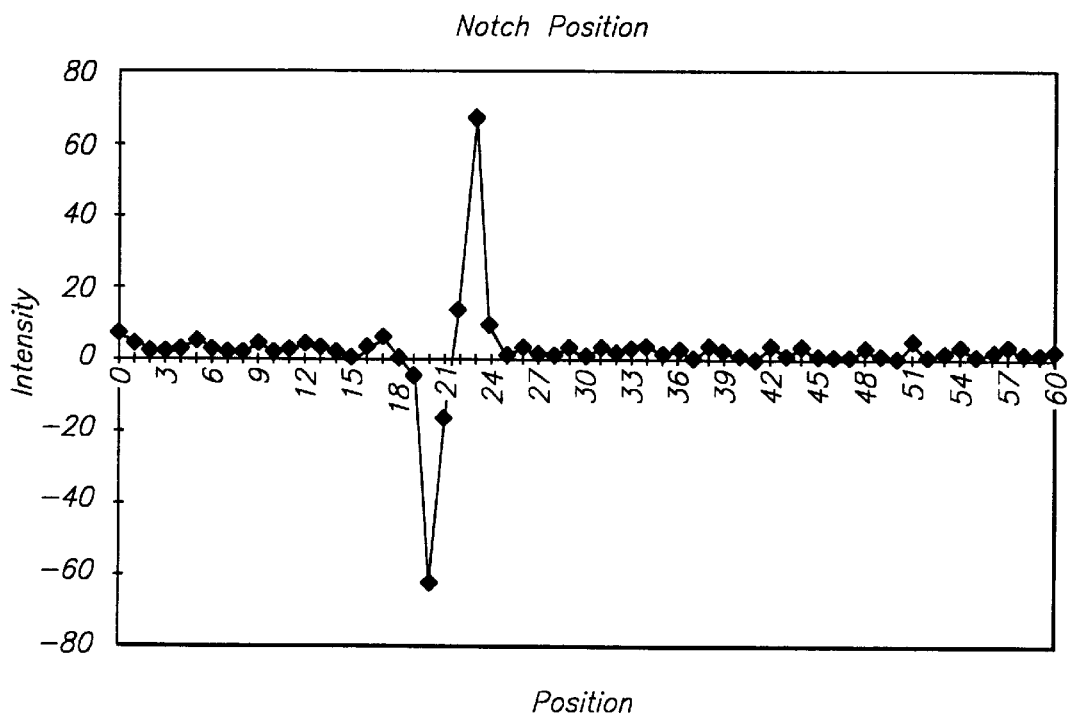

According to the preferred embodiment of the invention, to determine the center CW of the wafer W relative to the center CR of the spindle 108, the wafer W is continuously rotated through one complete revolution and edge positions are sampled at a plurality of points such as 800 points. The wafer can be rotated at any suitable speed such as 4 seconds per revolution. FIGS. 4a–c show results of measurements by a CCD array having a linear array of 2096 pixels (each pixel being 11 μm on each side) at the 800 points on an 8 inch wafer having a ⅛ inch wide by ⅛ inch deep V-shaped notch in the outer edge thereof. The spike in the curve between points 18 and 25 corresponds to the position of the V-shaped notch. The light intensity measured at the 800 points produces the curve shown in FIG. 4a, the derivative of which is shown in FIG. 4b. FIG. 4c is an enlarged version of FIG. 4b. As shown in FIG. 4c, the center of the V-shaped notch is located between points 21 and 22.

Figure 5A:
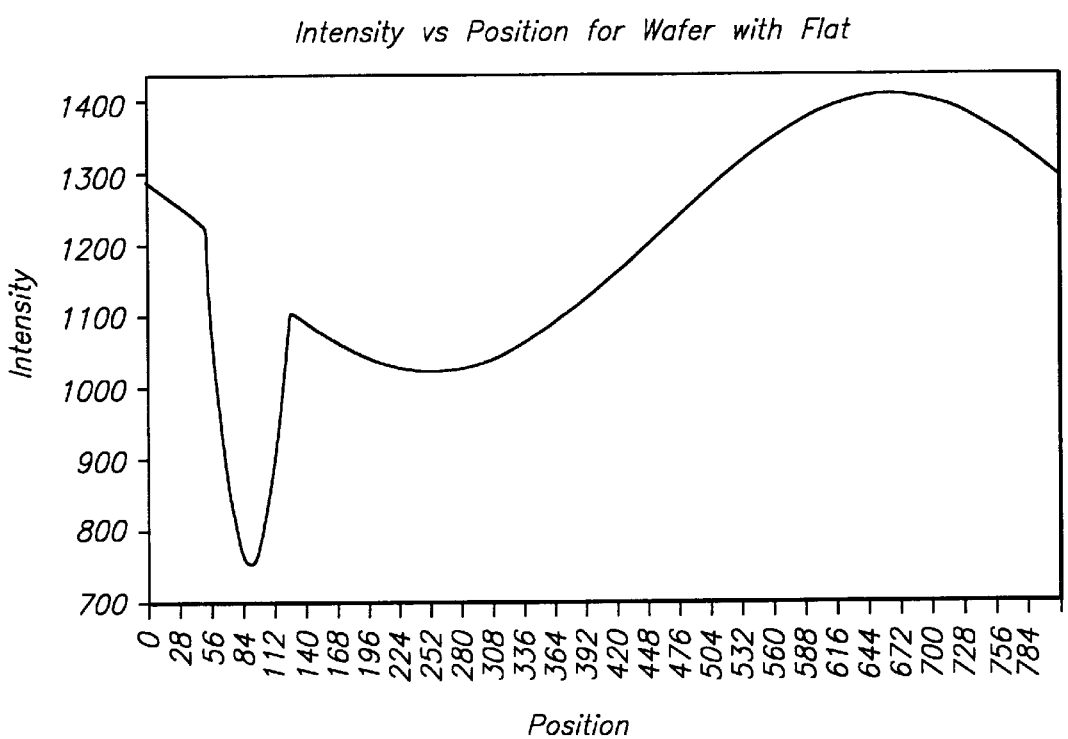
FIGS. 5a–5c show graphs of intensity measurements versus position and indicate the location of a flat on a semiconductor wafer.
Figure 5B:
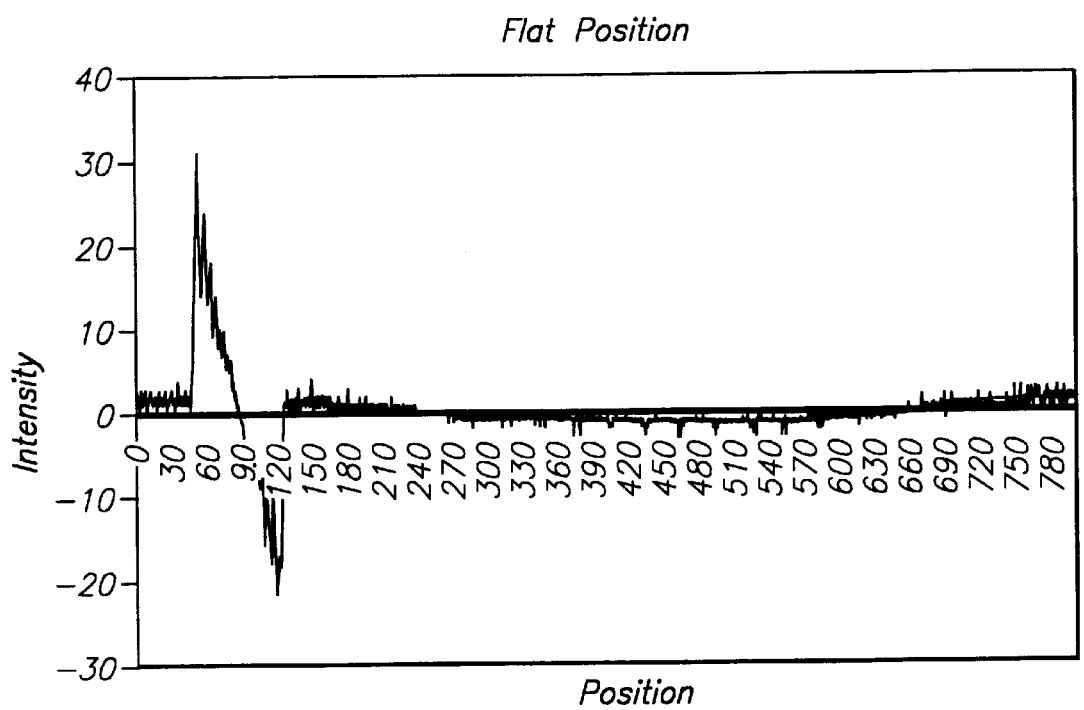
Figure 5C:
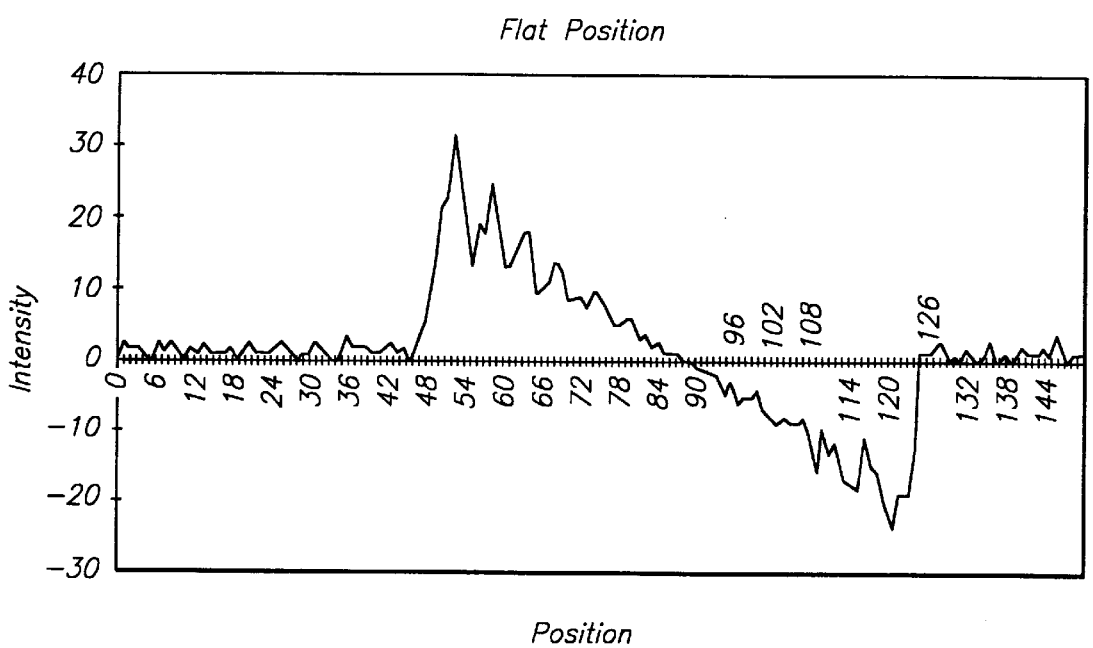

FIGS. 5a–c show graphs of light intensity versus position for the 800 points measured on a wafer having a flat about ½ inch long. Such flats are typically used on wafers having diameters of 4, 5, 6 and 8 inches. The spike in the curve of FIG. 5a corresponds to the location of the flat. FIG. 5b shows a derivative of the curve of FIG. 5a and FIG. 5c shows an enlarged version of the data shown in FIG. 5b. As shown, the center of the flat is located around positions 88–89.

The image projected onto the CCD array 104 is formed from the projection of the sheet of light onto the semiconductor wafer 106. As the semiconductor wafer 106 blocks or reflects part of the sheet of light 116 from reaching the CCD array, the part of the sheet of light 116 not blocked by the semiconductor wafer 106 reaches the array of CCD devices, each of which produces a signal when the sheet of light is projected upon it. The sheet of light should be sized to completely cover the CCD array when an object is not blocking the sheet of light from reaching the CCD array. For example, with the 2096 11×11 μm pixel array, the sheet of light should be wide enough (i.e., >11 μm) to cover the width of an individual pixel and have a length greater than the length of the 2096 pixels (i.e., >2.3056 cm).

The sheet of light 116 formed from the beam of light projected from the laser diode 104 through the optical lens 103 has a considerably higher degree of coherency compared to light from other sources, such as LED's, and as such is capable of forming a much sharper image. When part of the sheet of light 116 is blocked by the semiconductor wafer 106 to form the image of the edge of the semiconductor wafer 106 there are distortion effects which reduce the clarity and precision of the image projected onto the CCD array 104. These distortion effects are less pronounced when formed from highly coherent light sources, such as with laser light. By using a laser diode distortion effects are reduced thereby producing a sharper image of the semiconductor wafer 106. This sharper image represents a more accurate and precise representation of the location of the position of the edge of the semiconductor wafer 106. With a more precise and accurate image a higher resolution CCD array 104 can be used where there are more CCD devices percentimeter in the CCD array. The advantage of a higher resolution CCD array is that it gives a more precise reading of the position of the edge of the semiconductor wafer 106 due to its ability to more precisely locate the boundary between the image formed from the sheet of light 116 and the area where light is blocked due to the edge of the semiconductor wafer 106. Additionally, the use of a sheet of light according to the invention does away with the additional apparatus used to move the light source in commonly owned U.S. Pat. No. 4,833,790.

The correlated data stored in the memory of the microcontroller device is processed with a centering algorithm and an orientation algorithm to determine the physical center of the silicon wafer and the orientation of the crystalline lattice structure of the silicon wafer. From the correlated data the centering algorithm takes the reading from the CCD array at several angular positions of the spindle such as $I_0$, $I_{200}$, $I_{400}$ and $I_{600}$. With reference to one complete rotation of the spindle, since the 360° rotation of the spindle is graduated into 800 equal angular displacements, $I_0$ is separated from $I_{400}$ by 180°. Similarly, $I_{200}$ is separated from $I_{600}$ by 180°. From the precise measurements of the edge readings the eccentricity of the wafer's center can be calculated from:

$$X_{center} = \frac{I_{400} - I_0}{2}$$

$$Y_{center} = \frac{I_{600} - I_{200}}{2}$$

where $X_{center}$ is the x-coordinate of the center of the wafer and $Y_{center}$ is the y-coordinate of the center of the wafer. The radius r of the wafer can be calculated from:

$$r = \sqrt{X_{center}^2 + Y_{center}^2}$$

The location of the wafer's center from the center of rotation of the spindle can be determined from $X_{center}$, $Y_{center}$ and r.

It will be appreciated by those of ordinary skill in the art that the present invention can be embodied in other specific forms without departing from the spirit or essential characteristics thereof. The presently disclosed embodiments are considered in all respects to be illustrative and not restrictive. The scope of the invention is indicated by the appended claims rather than the foregoing description, and all changes that come within the meaning and range of equivalence thereof are intended to be embraced therein.

What is claimed is:

1. A light detection system for locating a center and/or discontinuity on an edge of a circular workpiece, comprising:
   a rotatable spindle supporting a circular workpiece such that opposed first and second sides of an outer periphery of the workpiece are located radially outwardly of the spindle, the spindle being rotatable about an axis of rotation so as to rotate the workpiece therewith;
   a light source facing the first side of the workpiece, the light source projecting a sheet of light intersected by the outer periphery of the workpiece;
   a light detector facing the second side of the workpiece and receiving a portion of the sheet of light not intersected by the outer periphery of the workpiece; and
   a controller electrically connected to a motor driving the spindle and to the light detector, the controller receiving signals outputted from the light detector and signals outputted from the motor, the controller being operable to rotate the spindle to a plurality of angular positions, record data corresponding to points on an outer edge of the workpiece and determine a center of the workpiece relative to the axis of rotation of the spindle.

2. The light detection system of claim 1, further comprising a transport mechanism engageable with the workpiece, the controller being operable to move the transport mechanism into engagement with the workpiece and move the workpiece to a position at which the center of the workpiece is coincident with the axis of the rotation of the spindle.

3. The light detection system of claim 1, wherein the light source comprises a laser diode and an optical lens, the optical lens focusing light from the laser diode into the sheet of light and the data recorded by the controller corresponding to light intensity measured by the light detector.

4. The light detection system of claim 1, wherein the light detector comprises a linear array of charge coupled devices which outputs data to the controller corresponding to measured light intensity.

5. The light detection system of claim 1, wherein the spindle is fixedly mounted so as to be immovable with respect to the light source and light detector.

6. The light detection system of claim 1, wherein the light source projects the sheet of light such that the sheet of light lies in a plane parallel to and passing through the axis of rotation of the spindle.

7. The light detection system of claim 1, wherein the light source comprises a laser diode.

8. The light detection system of claim 1, further comprising a workpiece transporting mechanism having an arm movable towards and away from the spindle, the arm of the workpiece transporting mechanism being movable to a position beneath the workpiece and engaging the workpiece by moving the spindle and lowering the workpiece onto the arm of the workpiece transporting mechanism.

9. The light detection system of claim 1, wherein the workpiece is a semiconductor wafer having a discontinuity along the outer periphery thereof, the controller being operable to determine the location of the discontinuity with respect to an angular orientation of the wafer and control rotation of the spindle to position the discontinuity at a desired angular orientation.

10. A method of detecting a center of a circular workpiece, comprising steps of:
   locating a circular workpiece on a rotatable spindle such that opposed first and second sides of an outer periphery of the workpiece are located radially outwardly of the spindle, the spindle cooperating with a light source facing the first side of the workpiece and a light detector facing the second side of the workpiece;
   projecting a sheet of light from the light source onto the workpiece such that the sheet of light is intersected by the outer periphery of the workpiece and a portion of the sheet of light not intersected by the outer periphery of the workpiece is received by the light detector;
   outputting signals from the light detector to a controller and recording data corresponding to a point on an outer edge of the workpiece;
   rotating the spindle such that the workpiece is rotated to a second angular position at which the sheet of light intersects the outer periphery of the workpiece, the controller receiving signals outputted from the light detector and recording data corresponding to a second point on the outer edge of the workpiece; and
   calculating a center of the workpiece relative to the axis of rotation of the spindle based on the data corresponding to the first and second points.

11. The method of claim 10, wherein the spindle is rotated by a motor electrically connected to the controller, the controller receiving signals outputted from the motor so as to record angular positions of the spindle.

12. The method of claim 10, further comprising moving a transport mechanism beneath the workpiece, placing the workpiece on the transport mechanism, moving the transport mechanism to a position at which the center of the wafer is coincident with the axis of rotation of the spindle, and removing the workpiece from the transport mechanism and placing the workpiece on the spindle.

13. The method of claim 10, wherein the light detector comprises a linear array of charge coupled devices and light source comprises a laser diode and an optical lens, the optical lens focusing light from the laser diode into the sheet of light.

14. The method of claim 10, wherein the signals are continuously outputted from the light detector and data corresponding to points on the outer edge of the workpiece are recorded during one continuous revolution of the workpiece.

15. The method of claim 10, wherein the spindle is fixedly mounted with respect to the light source such that the light source and spindle remain in the same positions while the signals corresponding to the first and second points are outputted by the light detector.

16. The method of claim 10, wherein the light source projects the sheet of light such that the sheet of light lies in a plane parallel to and passing through the axis of rotation of the spindle.

17. The method of claim 10, wherein the workpiece comprises a semiconductor wafer having a discontinuity on the outer periphery thereof, the method further comprising a step of determining the location of the discontinuity and rotating the spindle such that the discontinuity is located at a desired angular position.

18. The method of claim 10, wherein the location of a discontinuity on the edge of the workpiece is determined by calculating a derivative of a plot of light intensity versus position recorded by the controller.

19. The method of claim 10, wherein the location of a flat on the edge of the workpiece is determined by calculating a derivative of a plot of light intensity versus position recorded by the controller.

20. The method of claim 10, wherein the location of a V-shaped notch on the edge of the workpiece is determined by calculating a derivative of a plot of light intensity versus position recorded by the controller.

21. The light detection system of claim 1, wherein the light source projects the sheet of light such that the sheet of light lies in a plane parallel to the axis of rotation of the spindle.

22. The light detection system of claim 1, wherein the light source projects the sheet of light in a plane generally perpendicular to a plane of the workpiece.

23. The light detection system of claim 1, wherein the spindle rotates the workpiece such that the outer periphery of the workpiece passes between the light source and the light detector.

24. The method of claim 13, wherein the spindle rotates the workpiece such that the outer periphery of the workpiece passes between the light source and the light detector.

* * * * *